United States Patent
Aouini et al.

(10) Patent No.: US 10,715,169 B1
(45) Date of Patent: Jul. 14, 2020

(54) COARSE-FINE GAIN-TRACKING LOOP AND METHOD OF OPERATING

(71) Applicant: Ciena Corporation, Hanover, MD (US)

(72) Inventors: Sadok Aouini, Gatineau (CA); Tom Luk, Ottawa (CA); Naim Ben-Hamida, Nepean (CA); Christopher Kurowski, Ottawa (CA); Mohammad Honarparvar, Gatineau (CA); Soheyl Ziabakhsh Shalmani, Kanata (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/418,340

(22) Filed: May 21, 2019

(51) Int. Cl.
*H03M 1/68* (2006.01)
(52) U.S. Cl.
CPC .................... *H03M 1/68* (2013.01)
(58) Field of Classification Search
CPC ........................................... H01M 1/68
USPC ............................................. 341/135–148
See application file for complete search history.

(56) References Cited

U.S. PATENT DOCUMENTS

| | | | | |
|---|---|---|---|---|
| 4,924,223 A | * | 5/1990 | Okamoto | G06F 7/48 341/102 |
| 5,659,312 A | * | 8/1997 | Sunter | H03M 1/109 341/120 |
| 5,802,123 A | * | 9/1998 | Yoshimura | G11B 20/1403 327/147 |
| 5,973,631 A | * | 10/1999 | McMullen | H03M 1/1057 341/121 |
| 6,188,737 B1 | | 2/2001 | Bruce et al. | |
| 6,657,488 B1 | * | 12/2003 | King | H03F 3/087 327/307 |
| 6,871,304 B2 | | 3/2005 | Hadjihassan et al. | |
| 6,980,140 B1 | | 12/2005 | Rowland et al. | |
| 7,742,507 B1 | | 6/2010 | Kurowski et al. | |
| 8,855,215 B2 | | 10/2014 | Roberts et al. | |
| 9,625,662 B2 | | 4/2017 | Luk et al. | |
| 9,787,466 B2 | | 10/2017 | Aouini et al. | |
| 10,187,197 B2 | | 1/2019 | Aouini et al. | |
| 10,209,127 B2 | | 2/2019 | Luk et al. | |
| 10,243,671 B1 | | 3/2019 | Aouini et al. | |
| 2004/0052319 A1 | * | 3/2004 | Wakamatsu | H04L 27/2656 375/343 |
| 2011/0142457 A1 | | 6/2011 | Betty et al. | |
| 2013/0335150 A1 | * | 12/2013 | Sai | H03L 7/0991 331/15 |
| 2014/0145714 A1 | * | 5/2014 | Okatake | G01R 33/07 324/225 |
| 2018/0011125 A1 | * | 1/2018 | Oshima | G01P 15/125 |

(Continued)

FOREIGN PATENT DOCUMENTS

WO 98/55880 A1 12/1998

*Primary Examiner* — Lam T Mai
(74) *Attorney, Agent, or Firm* — Clements Bernard Walker; Christopher L. Bernard; Lawrence A. Baratta, Jr.

(57) ABSTRACT

A receiver gain tracking loop utilizing two Digital-to-Analog Converters (DACs) and methods for operating the gain tracking loop are provided. The gain tracking circuit includes a signal detector for detecting at least one signal and outputting a detected signal; a digital integrator connected in series to the signal detector for integrating the detected signal in the digital domain; two DACs connected in parallel to the digital integrator; and an analog summing element for summing the first digital output and the second digital output of the DACs producing a combined output.

20 Claims, 6 Drawing Sheets

(56) References Cited

U.S. PATENT DOCUMENTS

2018/0302070 A1 10/2018 Parvizi et al.
2019/0086471 A1 3/2019 Aouini et al.

* cited by examiner

COARSE-FINE GAIN-TRACKING LOOP AND METHOD OF OPERATING

FIELD OF THE DISCLOSURE

The present disclosure generally relates to a Digital-to-Analog Converter (DAC) circuit. More particularly, the present disclosure relates to a receiver gain tracking loop employing a combination of fine and coarse Digital-Analog-Converters (DACs) along with methods for operating.

BACKGROUND OF THE DISCLOSURE

Digital-to-Analog Converters (DACs) are decoding devices (electrical circuits) that convert digital data to its corresponding analog signal. One of the challenges associated with DAC performance is that it may be difficult to achieve an ideal output voltage. There are various static and dynamic measures of DAC performance. Static measures include Differential Non-Linearity (DNL) error, Integral Non-Linearity (INL) error, Monotonicity, Offset Error, Gain Error. Dynamic measures include Glitch, Settling Time, Signal-to-Noise Ratio (SNR), Spurious-Free Dynamic Range (SFDR), and the like.

In many applications, the use of DACs is straightforward. However, in some other applications, high-resolution DACs are used for calibration purposes. For example, Calibration DACs (CDACs) can be used to control the gain of a circuit that includes Op amps and 8 resistors; an 8-bit calibration DAC was used to make gain and offset adjustments in a pressure sensor, etc.

There are various types of DAC topologies, such as Thermometer-coded DAC, binary weighted DACs, Pulse Width Modulated (PWM) DACs, Pulse Density Modulated (PDM) DAC, hybrid DACs, current steering and stitched resistor DACs. Each of these architectures has their own pros and cons in terms of resolution, area occupancy, power consumption, monotonicity and settling times. Thermometer-coded DACs use $2^N-1$ equal size number of elements (current sources, resistors or capacitors). For instance, designing an 8-bit current mode DAC using this architecture would require using 255 current sources of equal quantity. This is the reason the digital input must be in the form of a thermometer code, and a thermometer decoder is needed to convert binary inputs into thermometer codes. The main advantage of this architecture is guaranteed monotonicity. However, area occupancy and power consumption are high. That is the reason they are rarely used for high-resolution DACs.

Binary weighted DACs utilize a binary weighted number of elements. For example, designing an 8-bit current-mode DAC using this architecture would require using 8 current sources only, which makes it area efficient compared to its thermometer-coded counterpart. One of the drawbacks of this architecture is that for high-resolution designs (>10 bits), the difference between the Most Significant Bits (MSBs) and Least Significant Bits (LSBs) weights is large and the output becomes very sensitive to mismatch errors and glitches. This might lead to a non-monotonic DAC. In addition, the number of elements (current sources) that needs calibration is still high.

Hybrid DACs use a combination of the architectures indicated above. The most common type of hybrid DACs is the segmented (Two-Path) DAC. In this DAC, the thermometer-coded architecture is used for the MSBs, and the binary weighted one is used for the LSBs. This makes use of the advantages offered by the two architectures. Segmented DACs are often used to design high resolution and low area/power devices. However, it is always a challenge to find the optimum number of segmentations, i.e., the number of bits that should be thermometer-coded. In addition, the need of the complex circuitry for the thermometer-coded architecture is not totally resolved in segmented DACs. For high-resolution DACs, Dynamic Element Matching (DEM) is widely used to compensate for matching errors that affect the linearity of the DAC. This technique is implemented using encoders which are complex and burn a lot of energy.

Known systems and methods of designing gain control loops have utilized a single DAC to convert the processed digital gain to an analog signal controlling the gain of the amplifier. Such systems achieve results having very stringent DAC specifications, e.g., equivalent number of bits (ENOB), DNL, INL, power, and size. Such systems require an ENOB of 16-bits with very tight DNL/INL specs (less than 1<LSB). This results in very large, power-hungry DACs that need oversampling, i.e. Sigma-Delta ($\Sigma\Delta$).

BRIEF SUMMARY OF THE DISCLOSURE

Embodiments of a gain tracking circuit are provided. In an embodiment, a gain tracking circuit includes: a signal detector for detecting at least one signal and outputting a detected signal; a digital integrator connected in series to the signal detector for integrating the detected signal in the digital domain; a first Digital-to-Analog Converter (DAC), connected in parallel to the digital integrator, and produces a first digital output; a second DAC, connected in parallel to the digital integrator, that produces a second digital output; and an analog summing element for summing the first digital output and the second digital output to produce a combined output. The at least one signal may include a desired analog-to-digital converter root mean square signal. Also, the combined output may be fed back into the signal detector signal detector as a measured analog-to-digital converter root mean square signal, for example. In an embodiment, the first DAC is a Fine-AC DAC and the second DAC is a Coarse-DC DAC.

The gain tracking circuit may further comprise a first multiplier connected in parallel to the digital integrator and connected in series to the first DAC; and a second multiplier connected in parallel to the digital integrator and connected in series to the second DAC. In an embodiment, a second integrator is connected in series between the second multiplier and the second DAC. In an embodiment, a Low Pass Filter (LPF) may be connected to the second DAC for filtering the second digital output prior to summing by the analog summing element. In another embodiment, the combined output is fed into a gain control element connected in series to the signal detector. The gain control element may comprise a transimpedance multiplier (TIA).

Embodiments of a method of operating a gain tracking circuit are also provided. In an embodiment, the steps of operation include detecting a signal at a signal detector and outputting a detected signal; integrating the detected signal in the digital domain and outputting an integrated signal; providing the integrated signal to a first Digital-to-Analog Converter (DAC) and a second DAC; at the first DAC, receiving the integrated signal and outputting a fine analog signal; at the second DAC, receiving the integrated signal and outputting a coarse analog signal; and performing an analog summation of the fine analog signal and the coarse analog signal to produce a combined output signal. The at least one signal includes a desired analog-to-digital converter root mean square signal In an embodiment, the first DAC is a Fine-AC DAC and the second DAC is a Coarse-DC DAC. The method may further comprise feeding back the combined output signal to the signal detector. In another embodiment, an output of the gain control element is fed back to the signal detector as a measured analog-to-digital converter root mean square (ADC RMS) signal.

In an embodiment, the method comprises splitting the detected signal along a proportional path and an integral path; and integrating the detected signal along the integral path, prior to providing the integrated signal to the second DAC. In another embodiment, the method comprises utilizing a Low Pass Filter (LPF) to filter the coarse analog signal prior to performing the analog summation. The method may also include passing the combined output signal through a gain control element connected in series to the signal detector. The gain control element may include a transimpedance multiplier.

BRIEF DESCRIPTION OF THE DRAWINGS

The present disclosure is illustrated and described herein with reference to the various drawings, in which like reference numbers are used to denote like system components/method steps, as appropriate, and in which:

FIG. 5(a) is the first integrator output, FIG. 5(b) is the second integrator output; FIG. 5(c) is the fine DAC output; and FIG. 5(d) is the coarse DAC output.

DETAILED DESCRIPTION OF THE DISCLOSURE

The present disclosure relates to systems and methods for operating an implementation of a receiver gain tracking loop utilizing two DACs. The proposed receiver gain-tracking loop circuits and methods of operating described herein can be utilized in applications where low power and small printed circuit board (PCB) or integrated circuit (IC) footprint are needed such as mixed analogue-digital chipsets, e.g., transimpedance amplifiers (TIAs), drivers, etc. In addition, the proposed DAC architecture can be used by built-in test circuitry by generating accurate reference voltages and/or currents. In an embodiment, a Fine DAC is combined with a Coarse DAC in a segmented second order tracking loop. The Coarse DAC is used to track out any "slowly-moving" common-mode portion of the signal, whereas the Fine DAC tracks the "fast" changing AC signal. The Fine DAC's dynamic range can overlap a few least significant bits (LSBs) of the Coarse DAC. One advantage of embodiments of the present disclosure is that the two DACs do not need to be matched. The gain tracking loop circuit design guarantees that no "glitching" occurs and will settle to the resolution provided by the Fine DAC, whereas the coarse DAC covers the required dynamic range. In addition, the first or "common" integration occurs in the digital domain, and just after the signal detection, rather than after the DAC processing/conversion and signal summation. This configuration allows for the segmentation of the proportional and integral paths and minimization of power and footprint when implemented in a PCB or IC.

Some of the additional benefits and advantages of the embodiments of the gain-tracking loops described herein are that they can be utilized for all applications that require a tracking loop or servo loop to correct and lock a circuit (electronics or mechanical) using error-sensing negative feedback. This includes communication (wireless to optical wireline) applications as well as mechanical engineering (automotive to robotics). Furthermore, in contrast to known solutions, embodiments of the present invention provide benefits and advantages that include: no need to have Differential Non-linearity/Integral Non-linearity (DNL/INL) on the order of 16-bits; no sigma-delta modulation or dynamic element matching is needed; no need for oversampling; no need for calibration; very low-power conversation; and a minimized PCB or IC footprint.

Gain Tracking Loop

Figure 1:
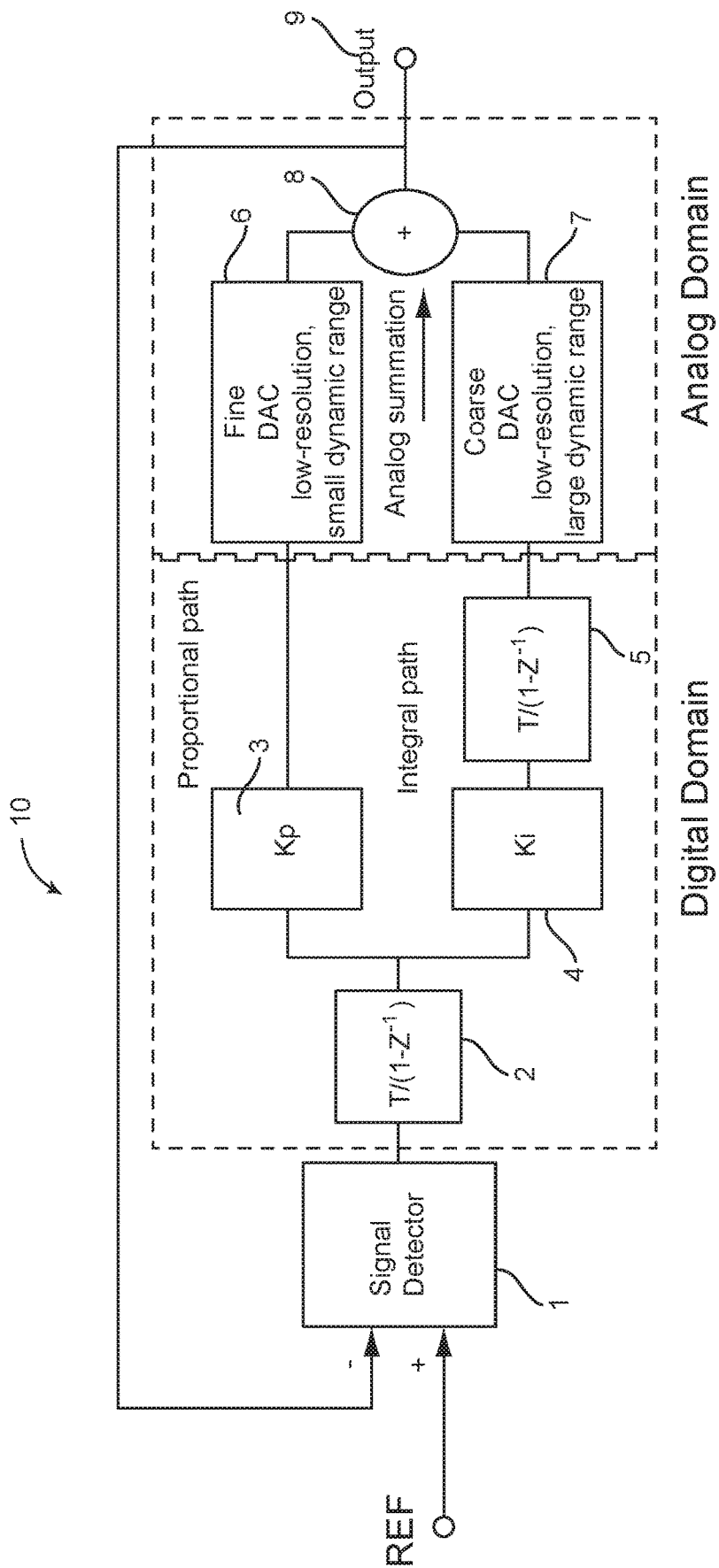
FIG. 1 is an embodiment of a block diagram of receiver gain tracking loop employing a combination of a first DAC and a second DAC.

FIG. 1 is a block diagram of an embodiment of a receiver gain tracking loop 10 employing a combination of two DACs, a Fine DAC and a Coarse DAC. As shown, a two-part signal is detected by the signal detector 1, and then fed into an integrator 2. The two-part signal consists of a reference signal and a feedback output 9 of the receiver gain tracking loop 10. The first integrator 2 is a common integrator in the digital domain. In this embodiment, the first integrator has a time delay, as referenced by the formula $T/1-z^{-1}$, where T is the digital clock period. An embodiment of a first integrator 2 with no delay may also be used. The output of the first integrator 2 is split along two paths, a proportional path and an integral path. Along the proportional path, the output of the first integrator 2 is fed into a gain factor or multiplier $K_p$ 3 in the digital domain, the output of which is fed into a first DAC 6. In an embodiment, the first DAC 6 is a Fine-AC DAC. The first DAC 6 may also be a low-resolution DAC with a small dynamic range. Along the integral path, the output of the common integrator 2 is fed into multiplier $K_i$ 4 and then a second integrator 5. The output of the second integrator 5 is then fed into a second DAC 7, which is a Coarse-DC DAC. The second DAC 7 may be a low-resolution DAC with a large dynamic range. In this embodiment of the gain tracking loop 10, the output of the first DAC 6 and the second DAC 7 is then fed into an analog summation element 8 to achieve an output 9. The output 9 is then fed back into the signal detector 1 as part of the two-part signal input.

Also, in this embodiment of the gain tracking loop 10, both the first and second integrations, and the amplifying steps occur in the digital domain. The processing by the first DAC 6 and the second DAC 7 and the summation step via the analog summation element 8 occurs in the analog domain. As noted above, the first integrator 2 is a common integrator in the digital domain. The common integration by the first integrator 2 that occurs in the digital domain allows for both the first DAC 6 and the second DAC 8, to have low-resolution prior to doing the step of summation via the summation element 8 in the analog domain. This has the benefit and advantage of providing a low power and small size mixed analog-digital tracking loop.

Figure 2:
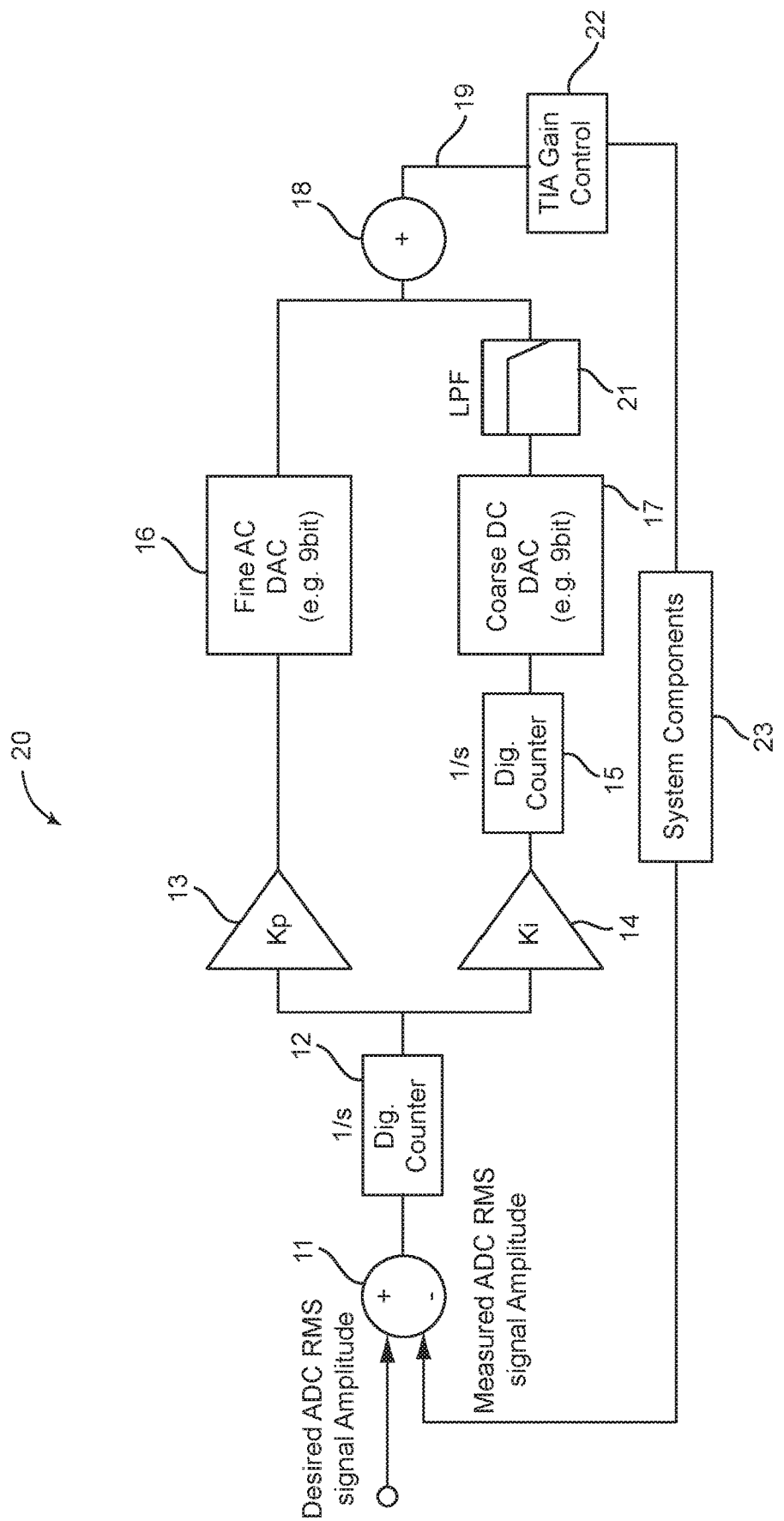
FIG. 2. is another embodiment of a block diagram of receiver gain tracking loop employing a combination of Fine-AC DAC and a Coarse-DC DAC.

FIG. 2 is a block diagram of another embodiment of a receiver gain tracking loop 20 employing a combination of Fine-AC DAC and a Coarse-DC DAC. In this embodiment, the receiver gain tracking loop 20 has a two-part signal that is fed into a signal detector 11. The signal consists of a desired analog-to-digital converter root mean squared (ADC RMS) signal amplitude, and a measured ADC RMS signal amplitude. In this embodiment, the output of the signal detector 11 is fed into a digital counter 12. The output of the digital counter 12 is split along two paths, a proportional path and an integral path. Along the proportional path, the output of the digital counter 12 is fed into a multiplier $K_p$ 13 and then a first DAC 16. Along the integral path, the output of the digital counter 12 is fed into a multiplier $K_i$ 14 and then a second digital counter 15. The output of the digital counter 15 is then fed into a second DAC 17, the output of which is fed into a Low Pass Filter (LPF) 21. The first DAC 16 may be a Fine-AC DAC and the second DAC 17 may be a Coarse-DC DAC.

In this embodiment, the output of the first DAC 16 is summed with the output of the LPF 21 and summed by a summing element 18, such as a current summation. The summed output 19 is fed into a Transimpedance Amplifier (TIA) Gain Control element 22. The output of a TIA Gain Control element 22 is fed back into the signal detector 11 as the measured ADC RMS signal amplitude. As such, one benefit and advantage of the receiver gain tracking loop 20 is that the measured ADC RMS signal tracks the Desired ADC RMS signal and may be configured to do so with an error of less than $\frac{1}{2}^{16}$. Along with a TIA gain control element 22, the feedback path may also include additional system components 23, such one or more ADCs, amplifier(s), look up tables etc.

By relaxing the DAC constraints, as depicted in the above embodiments of the receiver gain tracking loop, the smallest power and area for the receiver gain tracking loop system may be achieved. Since it does not require oversampling and it uses two low resolution DACs (instead of a large DAC having a 16-bit ENOB), detectability can be achieved by measuring the power, and finding the maximum clock frequency, through the Input/Outputs (IOs).

System Implementation and Applications

It can be noted that the DACs utilized in embodiments of the present invention can be implemented in common DAC topologies (e.g. binary, thermometer, current-steering, stitched resistor etc.). In an embodiment, a current-steering DAC topology is utilized as the currents from the Fine-AC DAC and the Coarse-DC DAC can easily be summed by shorting the outputs together.

Figure 3:
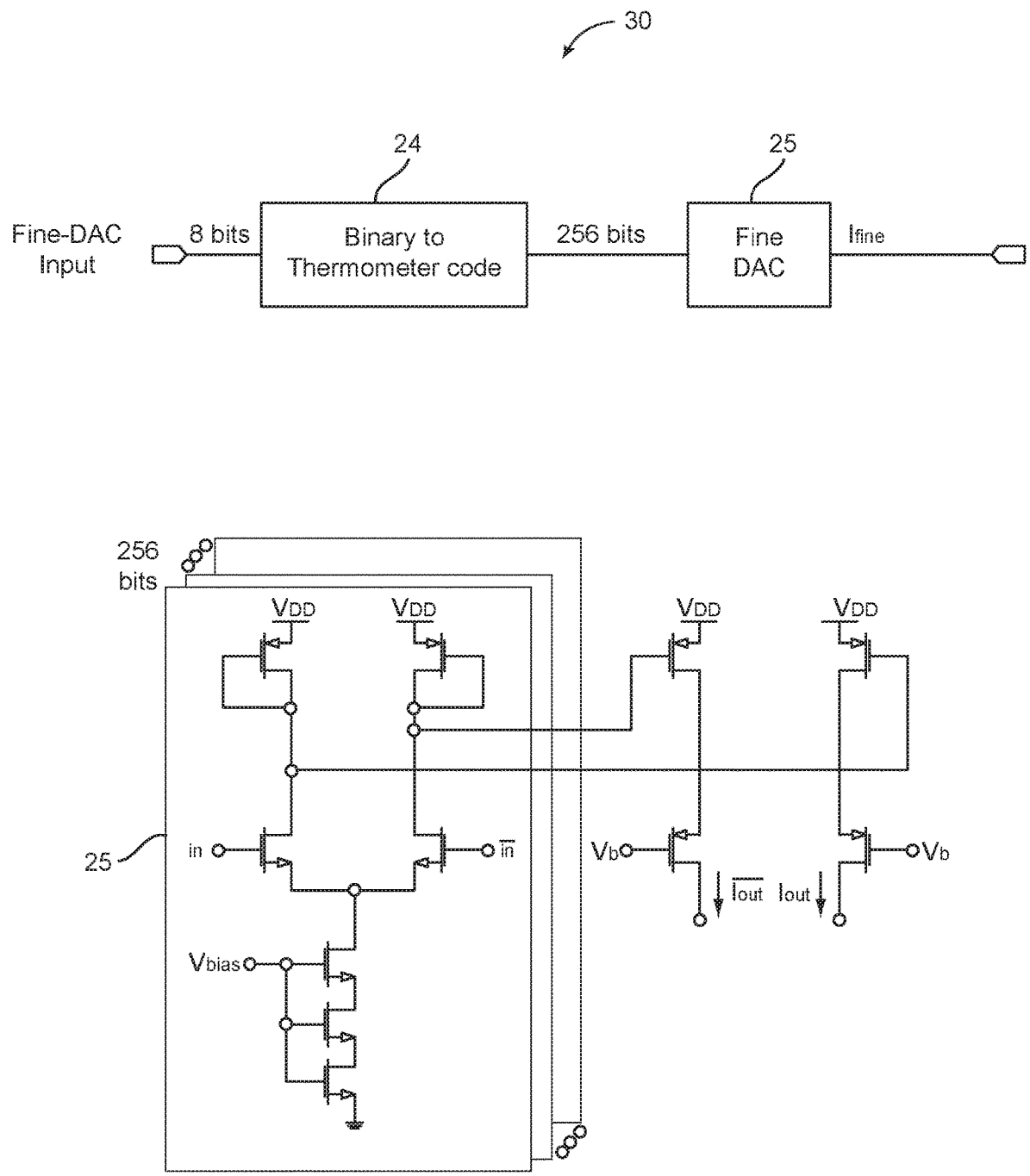
FIG. 3 is an example of a thermometer-coded current steering DAC that can be used in the receiver gain-tracking loop of FIG. 1.

FIG. 3 is an example of a thermometer-coded current steering 8-bit DAC 30 that can be used in the receiver gain-tracking loops of the embodiments of the present disclosure, including the embodiments of the first DAC 6 and the fine AC DAC 16 depicted in FIGS. 1 and 2. The Fine DAC input corresponds to the output of multiplier $K_p$ 3 or 13 in FIGS. 1 and 2. In one embodiment, as illustrated in FIG. 3, the input of the Fine DAC input 25 is 8-bits in size and is fed into a binary to thermometer code element 24. After transformation by the binary to thermometer code element 24, a 256-bit output is produced, which then enters a Fine DAC 25, and outputs a current $I_{fine}$. In a gain track loop implementation according to the present disclosure, Tripe would then be summed by the summation element 8 or 18.

Figure 4:
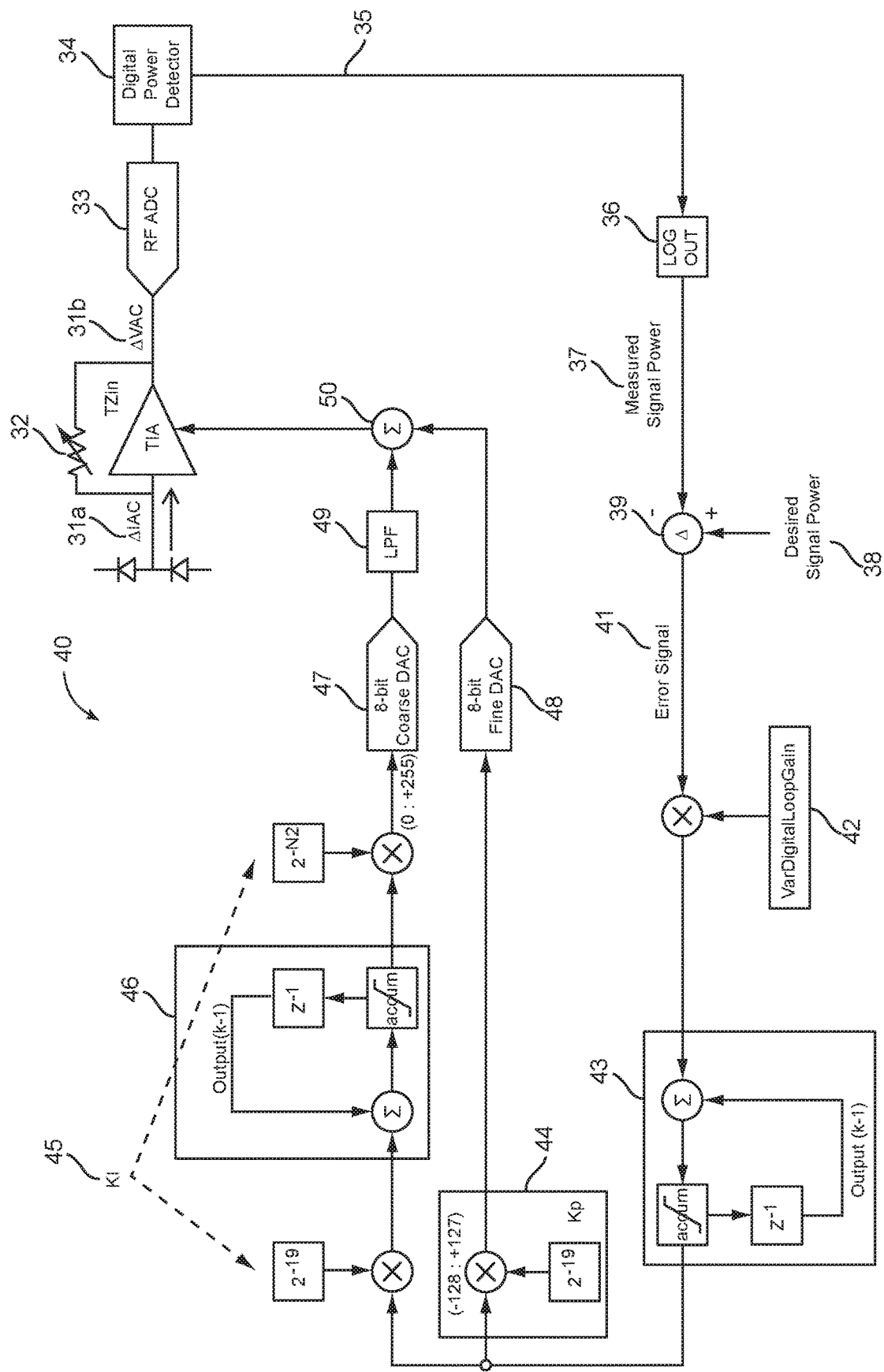
FIG. 4 is yet another embodiment of a receiver gain-tracking loop providing additional detail and system components.

FIG. 4 is yet another embodiment of a receiver gain-tracking loop 40 according to the present specification. While specific bit values are provided for example purposes, they are not intended to limit the function and capabilities of the receiver gain-tracking loops of the present disclosure.

Turning to FIG. 4, a transimpedance amplifier circuit 32 amplifies an AC input current $\Delta I_{AC}$ 31a to an AC output voltage $\Delta V_{AC}$ 31b. The AC voltage $\Delta V_{AC}$ 31b is then converted to a digital signal by the RF ADC block 33, such that $V(t) \rightarrow X(t)$, where X is a digital value. For example, if the ADC is 8-bit, then X can be a value between −128 to +127 for a two's complement ADC output.

The function of the Digital Power Detector 34 is to accumulate the square of N number of ADC samples, in other words, the power of each ADC sample. The output 35 of the Digital Power Detector 34 is $\Sigma_{n=1}^{N}(X_n)^2$. The logarithmic look-up table (LOG LUT) 36 converts the linear digital power samples to logarithmic digital power samples. The digital gain control loop operates in logarithmic data samples. The output of the LOG LUT 36 is labeled as Measured Signal Power 37. The Measured Signal Power 37 is compared with the Desired Signal Power 38. The output of the delta block 39 is the Error Signal 41 such that:

Error Signal=Desired Signal Power−Measured Signal Power.

The Error Signal 41 is multiplied by a value called VarDigitalLoopGain 42. The purpose is to enable $K_p$ and $K_i$ to be implemented as a simple binary scalar, such as a bitshift. The product of VarDigitalLoopGain 42 is accumulated by the first integrator 43. The first integrator 43 is 27 bits two's complement. The output of the first integrator 43 is scaled by $2^{-19}$ ($K_p$) in the multiplier block $K_p$ 44 to provide an 8-bit two's complement value (−128 to +127). That is, 27-bit two's complements scaled by $2^{-19}$=8 bits two's complement. The 8-bit two's complement value is sent to the 8-bit Fine DAC 48.

Since the value $K_i$ for this loop is much less than $K_p$, the multiplier block $K_i$ 45 is introduced as a combination before and after the second integrator 46. The output of the first integrator 43 is first scaled by $2^{-19}$, then sent to the second integrator 46 and finally scaled by $2^{-19}$ again. The analogue voltage of the 8-bit Coarse DAC 47 is fed to a LPF 49. Then, the analogue voltage of the 8-bit Fine DAC 48 and the filtered output of the 8-bit Coarse DAC 47 is summed together by a summing element 50 and sent to the transimpedance amplifier circuit 32.

Figure 5A:
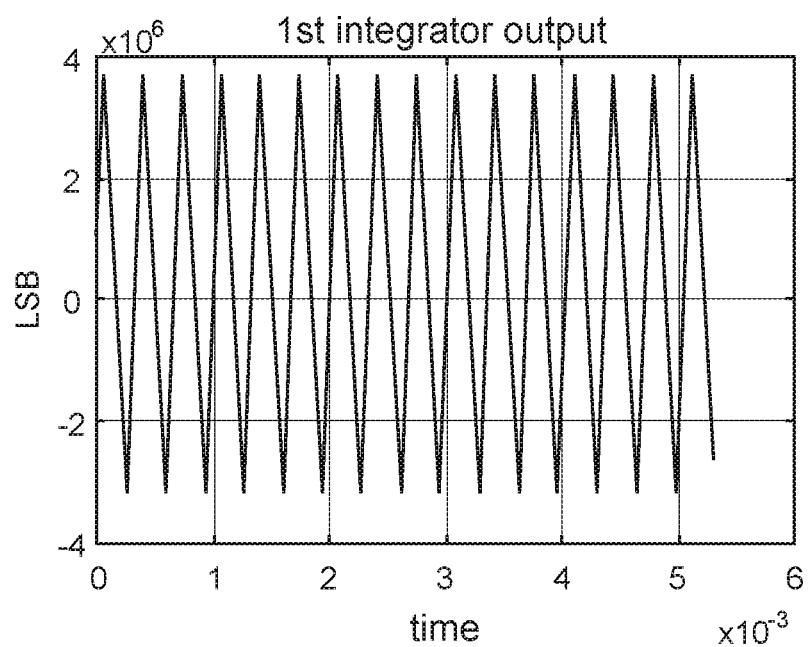
FIGS. 5(a)-5(d) illustrate a receiver gain tracking loop system simulation outputs of the first and second integrator and coarse and fine DACs as follows.
Figure 5B:
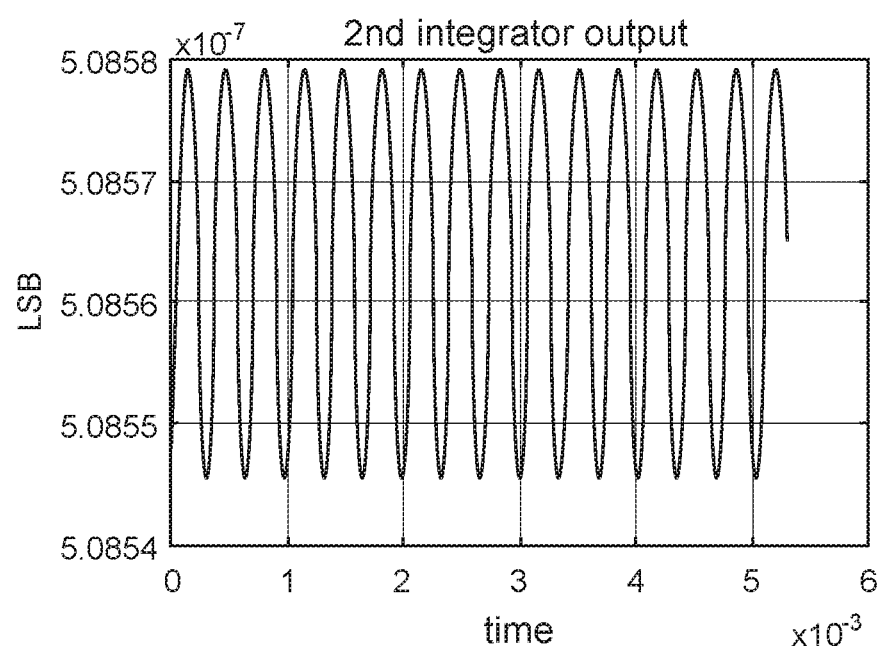
Figure 5C:
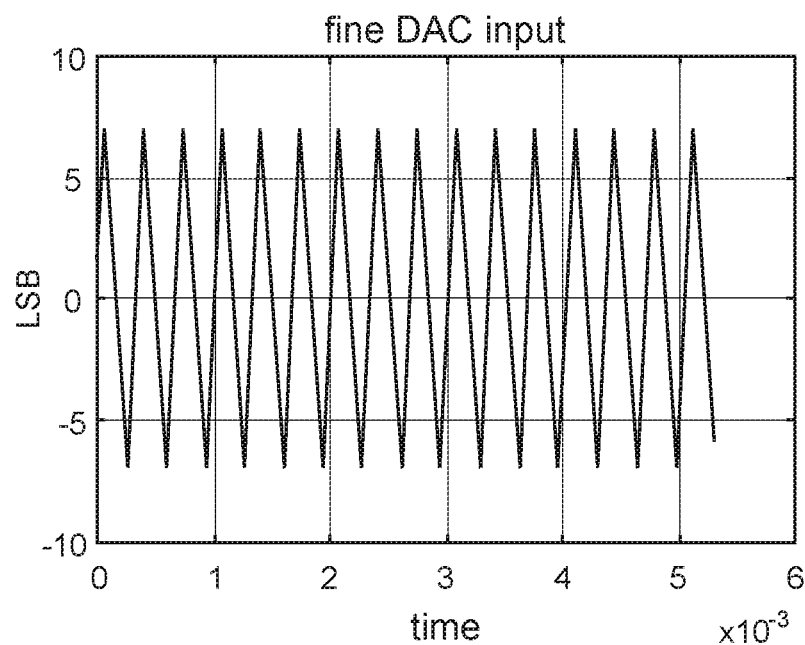
Figure 5D:
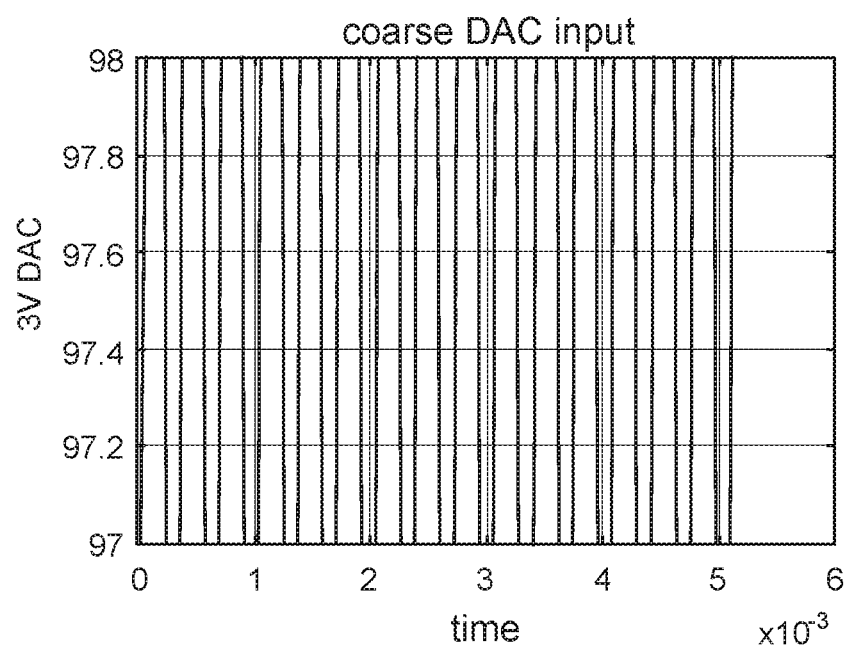

FIGS. 5(a)-5(d) illustrates simulated outputs of an example receiver gain tracking loop system according to the present disclosure. In this example, the outputs of the first and second integrator and coarse and fine DACs of this system are illustrated as follows: FIG. 5(a) is the first integrator output, FIG. 5(b) is the second integrator output; FIG. 5(c) is the fine DAC output; and FIG. 5(d) is the coarse DAC output. More specifically, FIG. 5(a) is the plot of the $1^{st}$ integrator output <27 bits, 2's> which can take on value between (−67, 108, 864 to +67, 108, 863). FIG. 5(b) is the plot of the $2^{nd}$ integrator output <27 bits> which can take on value between (0 to +134, 217, 727). FIG. 5(c) is a plot of the $K_p$ output <8 bits, 2's> which can take on value between (−128 to +127). For this example, when the input to coarse DAC jumps from 97 to 98, the input to fine DAC begins to ramp down from +7 to −7. When the coarse DAC jumps from 98 to 97, the fine DAC input begins to ramp up from −7 to +7. This cycle repeats itself. FIG. 5(d) is the plot of the Ki output <8 bits> which can take on value between (0 to +255). In this example, the input to the coarse DAC is toggling between 97 and 98. It can be noted that when coarse DAC input toggles between 97 and 98, the output of the coarse DAC is low-passed filtered such that the fine DAC output can track it via the $1^{st}$ integrator so that the sum output remains ~ stable. By utilizing the combination of the coarse and fine DACs as provided herein, the first integrator and the second integrator ramp up and down in unison with each other.

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A gain tracking circuit comprising:
a signal detector for detecting at least one signal and outputting a detected signal;
a digital integrator connected in series to the signal detector for integrating the detected signal in a digital domain;
a first Digital-to-Analog Converter (DAC), connected in parallel to the digital integrator, that produces a first digital output;
a second DAC, connected in parallel to the digital integrator, that produces a second digital output;
an analog summing element for summing the first digital output and the second digital output to produce a combined output;
a first multiplier connected in parallel to the digital integrator and connected in series to the first DAC; and
a second multiplier connected in parallel to the digital integrator and connected in series to the second DAC.

2. The gain tracking circuit of claim 1, wherein the combined output is fed back into the signal detector.

3. The gain tracking circuit of claim 1, further comprising a second integrator connected in series between the second multiplier and the second DAC.

4. The gain tracking circuit of claim 1, further comprising a Low Pass Filter (LPF) connected to the second DAC for filtering the second digital output prior to summing by the analog summing element.

5. The gain tracking circuit of claim 1, wherein the combined output is fed into a gain control element connected in series to the signal detector.

6. The gain tracking circuit of claim 5, wherein the gain control element comprises a transimpedance amplifier (TIA).

7. The gain tracking circuit of claim 5, wherein an output of the gain control element is fed back to the signal detector as a measured analog-to-digital converter root mean square signal.

8. The gain tracking circuit of claim 1, wherein the first DAC is a Fine-AC DAC and the second DAC is a Coarse-DC DAC.

9. The gain tracking loop circuit of claim 1, wherein the at least one signal includes a desired analog-to-digital converter root mean square signal.

10. A gain tracking circuit comprising:
a signal detector for detecting at least one signal and outputting a detected signal;
a digital integrator connected in series to the signal detector for integrating the detected signal in a digital domain;
a first Digital-to-Analog Converter (DAC), connected in parallel to the digital integrator, that produces a first digital output;
a second DAC, connected in parallel to the digital integrator, that produces a second digital output;
an analog summing element for summing the first digital output and the second digital output to produce a combined output; and
a Low Pass Filter (LPF) connected to the second DAC for filtering the second digital output prior to summing by the analog summing element.

11. The gain tracking circuit of claim 10, wherein the combined output is fed back into the signal detector.

12. The gain tracking circuit of claim 10, wherein the combined output is fed into a gain control element connected in series to the signal detector.

13. The gain tracking circuit of claim 10, wherein the first DAC is a Fine-AC DAC and the second DAC is a Coarse-DC DAC.

14. The gain tracking loop circuit of claim 10, wherein the at least one signal includes a desired analog-to-digital converter root mean square signal.

15. A gain tracking circuit comprising:
a signal detector for detecting at least one signal and outputting a detected signal;
a digital integrator connected in series to the signal detector for integrating the detected signal in a digital domain;
a first Digital-to-Analog Converter (DAC), connected in parallel to the digital integrator, that produces a first digital output;
a second DAC, connected in parallel to the digital integrator, that produces a second digital output; and
an analog summing element for summing the first digital output and the second digital output to produce a combined output, wherein the combined output is fed into a gain control element connected in series to the signal detector.

16. The gain tracking circuit of claim 15, further comprising
a first multiplier connected in parallel to the digital integrator and connected in series to the first DAC; and
a second multiplier connected in parallel to the digital integrator and connected in series to the second DAC.

17. The gain tracking circuit of claim 16, further comprising a second integrator connected in series between the second multiplier and the second DAC.

18. The gain tracking circuit of claim 15, further comprising a Low Pass Filter (LPF) connected to the second DAC for filtering the second digital output prior to summing by the analog summing element.

19. The gain tracking circuit of claim 15, wherein the first DAC is a Fine-AC DAC and the second DAC is a Coarse-DC DAC.

20. The gain tracking loop circuit of claim 15, wherein the at least one signal includes a desired analog-to-digital converter root mean square signal.

* * * * *